United States Patent
Ooi et al.

(10) Patent No.: US 7,223,652 B2
(45) Date of Patent: May 29, 2007

(54) CAPACITOR AND MANUFACTURING METHOD THEREOF, SEMICONDUCTOR DEVICE AND SUBSTRATE FOR A SEMICONDUCTOR DEVICE

(75) Inventors: Kiyoshi Ooi, Nagano (JP); Yasuyoshi Horikawa, Nagano (JP); Tomoo Yamasaki, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 347 days.

(21) Appl. No.: 11/048,556

(22) Filed: Feb. 1, 2005

(65) Prior Publication Data
US 2005/0130368 A1 Jun. 16, 2005

Related U.S. Application Data

(62) Division of application No. 10/692,836, filed on Oct. 24, 2003, now Pat. No. 6,897,544.

(30) Foreign Application Priority Data
Oct. 29, 2002 (JP) .............................. 2002-314694

(51) Int. Cl.
*H01L 21/338* (2006.01)
*H01L 51/40* (2006.01)
*H01L 21/8244* (2006.01)
*H01L 21/8242* (2006.01)

(52) U.S. Cl. ............. 438/238; 438/250; 438/99; 438/171; 438/210

(58) Field of Classification Search ............ 438/99, 438/171, 210, 238–254
See application file for complete search history.

(56) References Cited

U.S. PATENT DOCUMENTS

| 6,015,596 | A | 1/2000 | Miwa et al. |
| 6,589,644 | B1 | 7/2003 | Yamada et al. |
| 6,737,118 | B2 | 5/2004 | Yamada et al. |
| 2001/0012896 | A1 | 8/2001 | Henton et al. |
| 2001/0013425 | A1 | 8/2001 | Rokugawa et al. |
| 2003/0089954 | A1 | 5/2003 | Sashida |

FOREIGN PATENT DOCUMENTS

| JP | 08-017726 | 1/1996 |
| JP | 09-008175 | 1/1997 |
| JP | 09-148746 | 6/1997 |
| JP | 11-026444 | 1/1999 |
| JP | 2000-138442 | 5/2000 |
| JP | 2001 274034 | 10/2001 |
| JP | 2002-223077 | 8/2002 |

*Primary Examiner*—Cuong Nguyen
(74) *Attorney, Agent, or Firm*—Ladas & Parry LLP

(57) ABSTRACT

A capacitor includes a capacitor part formed of a dielectric film sandwiched by a pair of electrodes and a support body formed of a film of an organic polysilane. The support body is provided so as to support the capacitor part thereon.

3 Claims, 17 Drawing Sheets

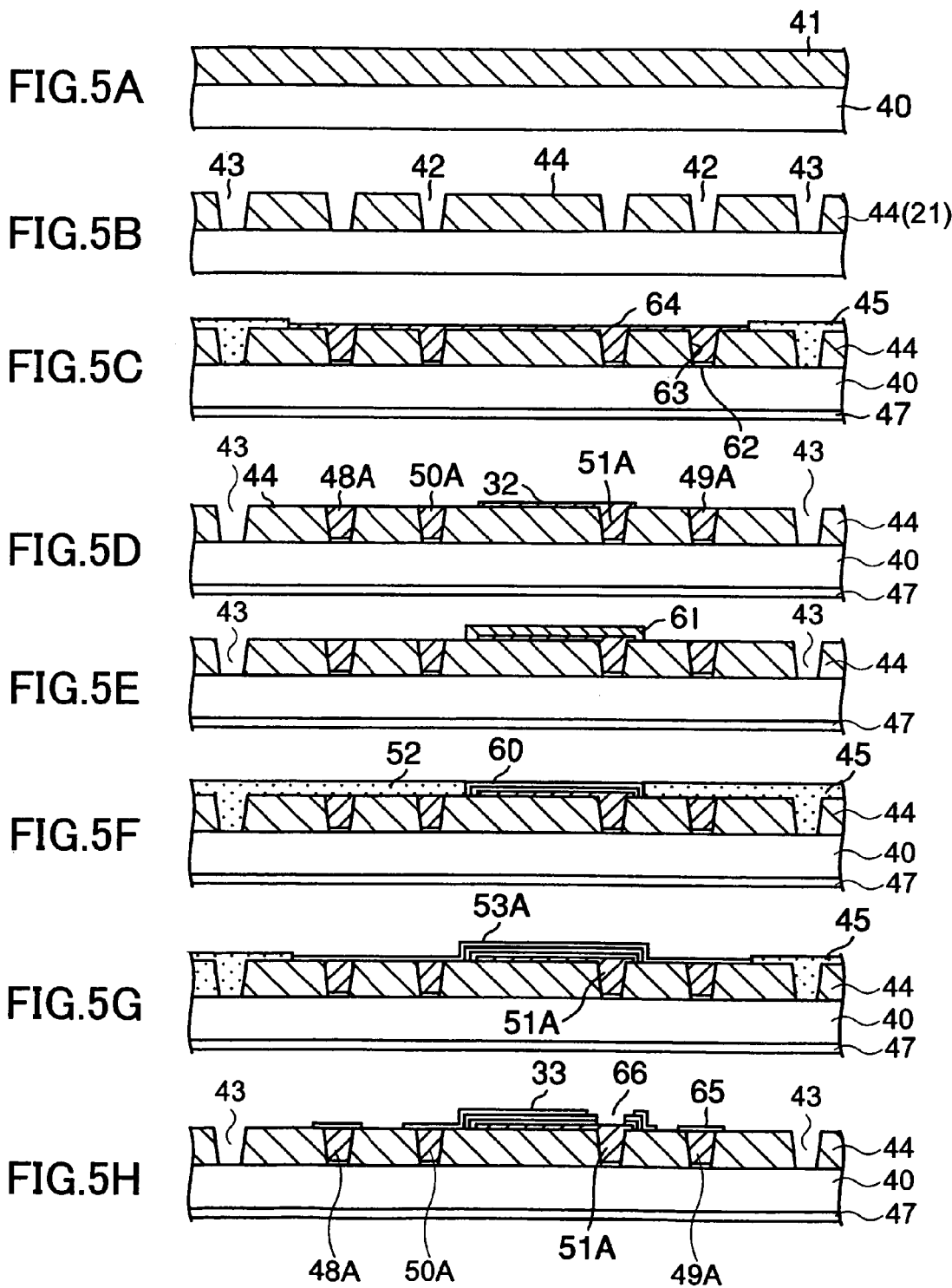

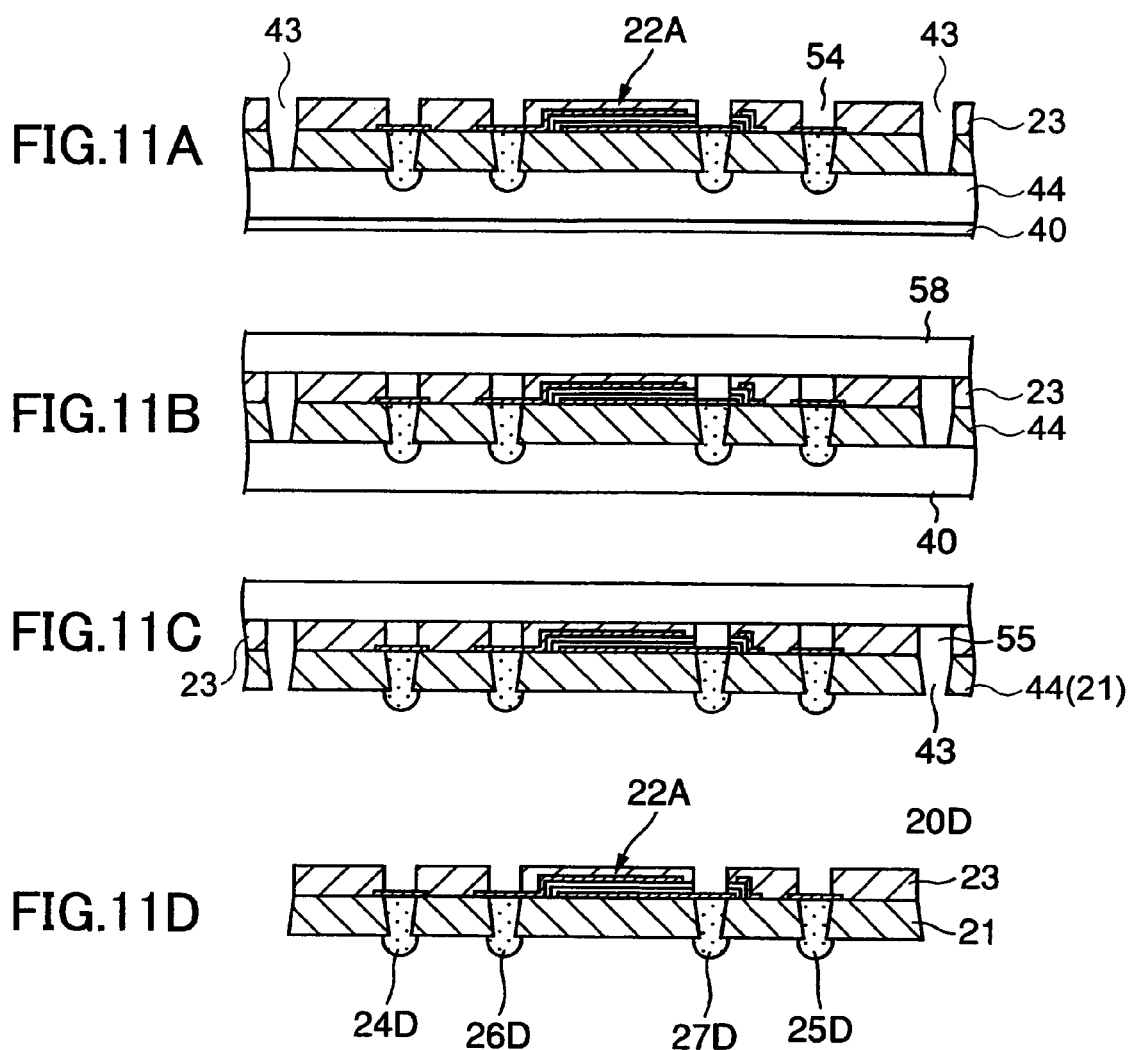

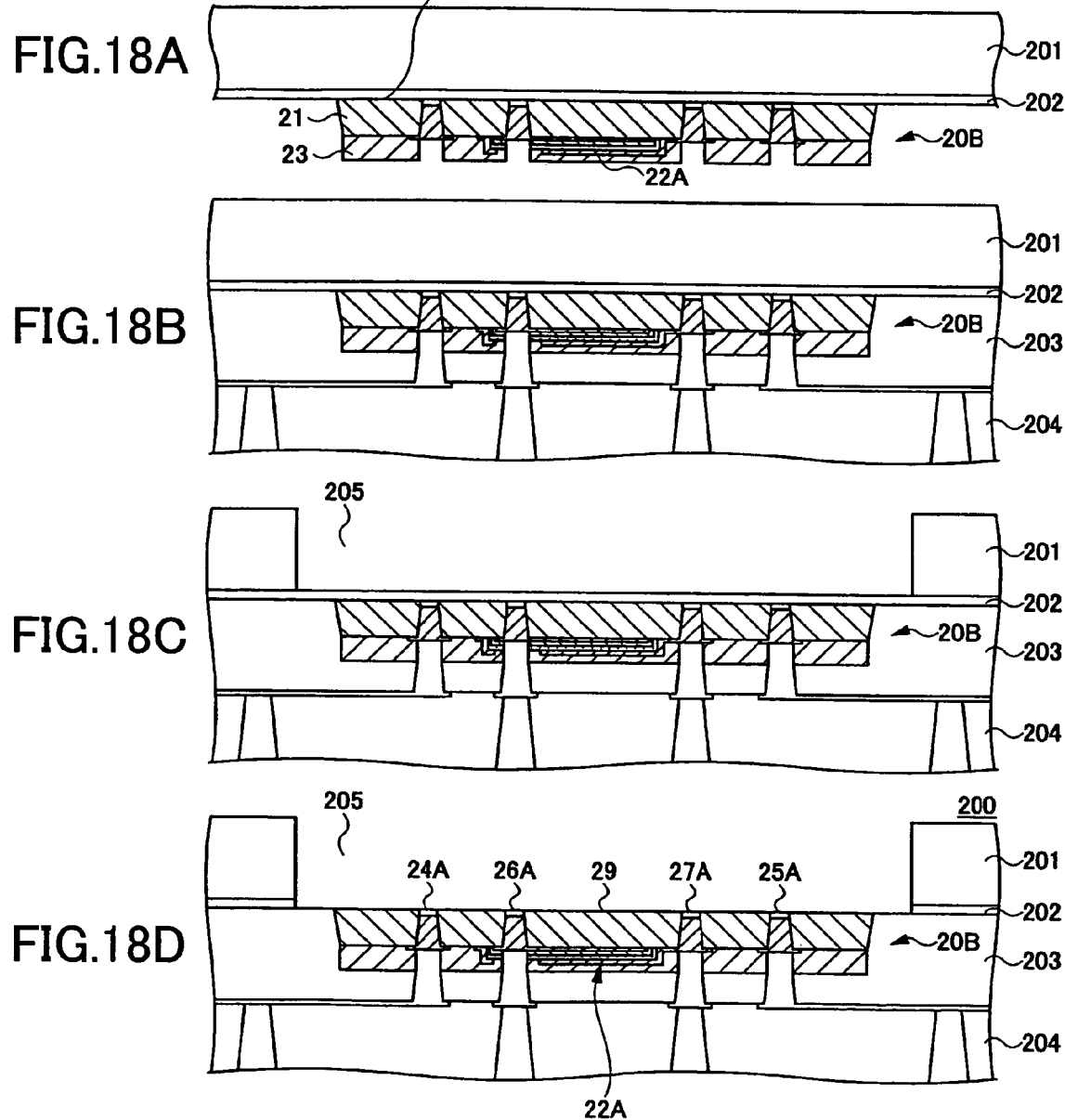

CAPACITOR AND MANUFACTURING METHOD THEREOF, SEMICONDUCTOR DEVICE AND SUBSTRATE FOR A SEMICONDUCTOR DEVICE

CROSS-REFERENCE TO RELATED APPLICATION

The present application is based on Japanese priority application No. 2002-314695 filed on Oct. 29, 2002, the entire contents of which are hereby incorporated by reference.

BACKGROUND OF THE INVENTION

The present invention generally relates to semiconductor devices and more particularly to a capacitor and manufacturing method thereof as well as a substrate having a capacitor.

With sharp increase of clock frequency in recent advanced semiconductor devices, supply of a stable electric power to semiconductor chip is becoming a paramount problem. In order to deal with this problem, there is a proposal to provide a capacitor on a substrate on which the semiconductor chip is mounted.

FIG. 20 shows a conventional semiconductor device 10.

Referring to FIG. 20, the semiconductor device 10 includes a substrate 11 mounted with a semiconductor chip 12, wherein the substrate 11 includes a substrate body 13 and a decoupling capacitor 14. The decoupling capacitor 14 is provided inside the substrate body 13. The decoupling capacitor 14 includes a dielectric film 16 formed on a silicon substrate 15, and a conductive film 17 is provided further on the dielectric film 16. Reference should be made to Japanese Laid-Open Patent Publication 2001-274034.

Here, it should be noted that the capacitor 14 is constructed on the silicon substrate 15 used as a support body, and thus, it is necessary to scribe the silicon wafer carrying the films 16 and 17 thereon at the time of the dicing process, while such a dicing process takes time and the efficiency of manufacturing a semiconductor device is decreased. Further, there is a need of complex process such as dry etching, wet etching or laser processing at the time of forming a through hole in the silicon substrate 15. Thus, such a complex process causes further degradation in the efficiency of manufacturing a semiconductor device.

Further, associated with the use of the silicon substrate 15 for the support of the capacitor, there arises a problem that the capacitor 14, and hence the substrate 11, inevitably has a considerable thickness.

Further, because of the fact that the capacitor is disposed offset in the construction of FIG. 20 from the surface of the substrate 11, on which the semiconductor chip 12 is mounted, there arises a problem in that the length of the conductor path connecting the semiconductor chip 12 and the capacitor 14 is increased. Associated with this, there occurs the problem of increase of parasitic inductance in the foregoing conductor path, and it becomes difficult to achieve the desired stabilization of the supply voltage to the semiconductor chip 12 because of the increased parasitic inductance in the case the operational frequency of the semiconductor chip 12 has been increased.

SUMMARY OF THE INVENTION

Accordingly, it is a general object of the present invention to provide a novel and useful capacitor and a manufacturing method thereof as well as a substrate having such a capacitor.

Another and more specific object of the present invention is to provide a capacitor, comprising:

a capacitor part comprising a dielectric film sandwiched by a pair of electrodes; and a support body of a film of an organic polysilane, said support body supporting said capacitor part thereon.

According to the present invention, the capacitor part is supported on a support body of organic polysilane film and the overall thickness of the capacitor can be reduced effectively. Because of the reduced thickness of the capacitor, the capacitor of the present invention can be embedded into a substrate of a semiconductor device without increasing the thickness of the substrate. Further, the capacitor having such a structure is easily manufactured.

Further, the capacitor of the foregoing construction has an advantageous feature, associated with the use of the organic polysilane film, in that the thermal expansion coefficient of the capacitor becomes generally equal to the thermal expansion coefficient of the semiconductor chip. Thus, it becomes possible to reduce the thermal stress between the semiconductor chip and the capacitor in the semiconductor device in which the semiconductor chip is mounted on the capacitor embedded in a substrate.

Further, because of the use of the organic polysilane substrate, the capacitor of the present invention can endure the high temperature used during the process of formation of the capacitor part.

Another object of the present invention is to provide a method of manufacturing a capacitor including a capacitor part in which a dielectgric film including a capacitor part in which a dielectric film is sandwiched by a pair of electrodes and a support body of an organic polysilane film supporting said capacitor part, comprising the steps of:

forming a layer of organic polysilane on a surface of a base material;

forming a first electrode on said layer of organic polysilane;

forming a dielectric film on said first electrode;

forming a second electrode on said dielectric film;

forming an insulation layer on said layer of organic polysilane and on said second electrode;

said layer of organic polysilane, said first electrode, said dielectric film, said second electrode and said insulation layer forming a layered body on said base material, forming a groove in said layer of organic silane and said insulation layer for dividing said layered body into individual capacitors; and removing said base material.

According to the present invention, division of the layered body into individual capacitors can be conducted merely by removing the base material, and the need of dicing the base material is eliminated. Thereby, the efficiency of production of the capacitor is improved substantially.

In a preferred embodiment, a tape is attached to the top surface of said insulation layer at the time of removing said base material. Thereby, the individual capacitors separated from each other with the removal of the base material are held on the tape with their original arrangement or order, without being mixed up. Thereby, the capacitors can be easily picked up one by one.

Another object of the present invention is to provide a substrate for mounting a semiconductor chip thereon, comprising:

a substrate body defined by upper and bottom surfaces;

a plurality of terminals provided on said top surface for connection with a semiconductor chip mounted on said top surface, said top surface thereby forming a chip-mounting surface;

a plurality of terminals provided on said bottom surface for external connection, said bottom surface thereby forming a mounting surface; and a capacitor embedded in said substrate body right underneath said chip-mounting surface, said capacitor comprising:

a capacitor part including a dielectric film sandwiched by a pair of electrodes; and a support body of an organic polysilane film supporting said capacitor part.

According to the present invention, the capacitor can be formed with reduced thickness as a result of use of the support body of organic polysilane film, and the overall thickness of the substrate can be reduced as well.

Because the capacitor is disposed right underneath the chip-mounting surface, the distance between the terminal provided on the chip-mounting surface and the capacitor is minimized, and the inductance associated with a conductor path between the foregoing terminal and the capacitor is also minimized. Thereby, it becomes possible to supply a stabilized supply voltage to the semiconductor chip mounted on the chip-mounting surface via the substrate of the present invention.

As a result of use of the organic polysilane for the support body of the capacitor, the present invention can successfully minimize the thermal stress caused between the semiconductor chip and the capacitor.

Another object of the present invention is to provide a method of manufacturing a substrate for mounting a semiconductor chip, said substrate having a mounting surface carrying thereon terminals for external connection at a lower principal surface and a chip-mounting surface for carrying a semiconductor chip at an upper principal surface, said substrate further including a capacitor embedded right underneath said chip-mounting surface such that said capacitor includes a capacitor part formed of a dielectric film sandwiched by a pair of electrodes and a support body of an organic polysilane film supporting said capacitor part, said capacitor having an insulation film covering said capacitor part, said method comprising the steps of:

bonding said capacitor on a base;

forming an insulation layer on said base such that said insulation layer covers said capacitor;

laminating a plurality of insulation layers on said base so as to cover said capacitor; and removing said base.

According to the present invention, it becomes possible to produce a substrate for mounting a semiconductor chip and embedded with a capacitor with improved efficiency.

Another object of the present invention is to provide a semiconductor device, comprising:

a substrate; and a semiconductor chip mounted on said substrate, said substrate comprising:

a substrate body defined by upper and bottom surfaces;

a plurality of terminals provided on said top surface for connection with said semiconductor chip mounted on said top surface, said top surface thereby forming a chip-mounting surface;

a plurality of terminals provided on said bottom surface for external connection, said bottom surface thereby forming a mounting surface; and a capacitor embedded in said substrate body right underneath said chip-mounting surface, said capacitor comprising:

a capacitor part including a dielectric film sandwiched by a pair of electrodes; and a support body of an organic polysilane film supporting said capacitor part.

According to the present invention, it becomes possible to minimize the thermal stress caused between the capacitor element and the semiconductor chip by forming the substrate body by an organic polysilane film. Further, because of the fact that the substrate can be formed with a reduced thickness as a result of the construction of the capacitor that uses the organic polysilane film as the support body, the overall size of the semiconductor device can be reduced also.

Other objects and further features of the present invention will become apparent from the following detailed description when read in conjunction with the attached drawings.

BRIEF DESCRIPTION OF THE DRAWINGS

FIGS. 5A–5H are diagrams showing the manufacturing process of the capacitor of FIG. 4;

FIGS. 11A–11D are diagrams showing the manufacturing process of the capacitor of FIG. 9 following the step of FIG. 10F;

FIGS. 18A–18D are diagrams showing the manufacturing process of a substrate according to a different embodiment;

DETAILED DESCRIPTION OF THE INVENTION

FIRST EMBODIMENT

Figure 1:
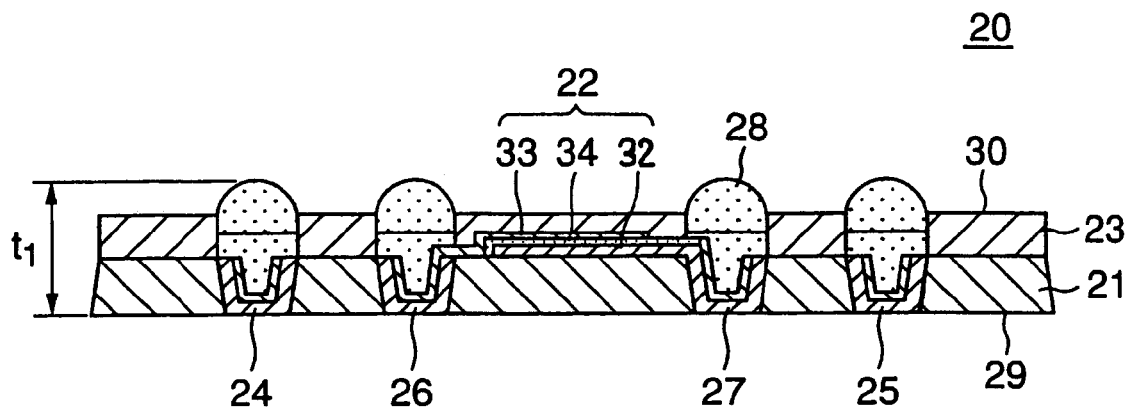
FIG. 1 is a diagram showing the construction of a capacitor according to a first embodiment of the present invention.

FIG. 1 shows the construction of a capacitor 20 according to a first embodiment of the present invention.

Referring to FIG. 1, the capacitor 20 is embedded in a substrate used for carrying a semiconductor chip in the state that the capacitor is exposed at the surface of the substrate, wherein the capacitor constitutes the mounting part of the semiconductor chip. The same holds true in capacitors 20A–20D to be explained later.

It should be noted that the capacitor 20 has a support body 21 formed of an organic polysilane film. The capacitor 20 has a size similar to that of the semiconductor chip mounted thereon, and includes, in addition to the support body 21, a capacitor part 22 formed on the support body 21 and an insulation layer 23 formed on the support body 21 so as to cover the capacitor part 22, wherein signal electrodes 24 and 25, a power terminal 26 and a ground terminal 27 are exposed at the bottom surface of the support body 21. Further, there is formed a solder bump 28 so as to project from the top surface of the insulation layer 23.

It should be noted that the signal terminals 24 and 25, the power terminal 26 and the ground terminal 27 are formed in correspondence to the contact pads of the semiconductor chip to be mounted on the substrate and penetrate through the support body 21 of organic polysilane film. Thus, the terminals 24–27 are exposed at the bottom surface of the support body 21. Further, solder bumps 28 are provided at the top side of the support body 21 in correspondence to the signal terminals 24 and 25, the power terminal 26 and the ground terminal 27 in mechanical as well as electrical contact therewith, wherein the solder bumps 28 are provided so as to project beyond a top surface 30 of the insulation layer 23. It should be noted that the surface 30 constitutes the chip-mounting surface on which a semiconductor chip is flip-chip mounted.

It should be noted that the capacitor part 22 has a construction in which a lower electrode 32 and an upper electrode 33 sandwich an anodic oxidation layer (dielectric layer) 34 therebetween, wherein the capacitor part 22 is protected by being disposed between the support body 21 and the insulation layer 23. It should be noted that the anodic oxidation layer 34 is formed on the surface of the lower electrode 32.

The lower electrode 32 is connected to the ground terminal 27 electrically, while the upper electrode 33 is connected to the power terminal 26 electrically. The capacitor part 22 is thus provided between the power terminal 26 and the ground terminal 27 and is embedded in the substrate on which the semiconductor chip is mounted as will be explained later. Thereby, the capacitor part 22 functions as a bypass capacitor or decoupling capacitor when the substrate is mounted on a printed circuit board in the state that a semiconductor chip is flip-chip mounted on the substrate, and the supply voltage supplied to the semiconductor chip is stabilized.

Because the support body 21 is formed of a film of organic polysilane, the capacitor 20 of present invention has an advantageous feature of reduced thickness for the overall capacitor thickness t1 as represented in FIG. 1.

In the construction of FIG. 1, polymethylphenyl silane having a skeleton of Si atoms and organic substituents at the side chains, is used for the foregoing organic polysilane. The polymethylphenyl silane has photoreactivity to UV radiation and has the feature that the glass transition temperature Tg and the thermal expansion coefficient (CTE) can be adjusted by the temperature of the post baking process. Thereby, the thermal expansion coefficient can be adjusted within the range of 10–100 ppm/K. Further, the support body 21 has a thermal expansion coefficient intermediate between the thermal expansion coefficient of the substrate itself and the thermal expansion coefficient of a silicon substrate (about 2.6 ppm/K).

Thus, the support body 21 has a thermal expansion coefficient close to the thermal expansion coefficient of a silicon substrate forming the semiconductor chip. In a semiconductor device 130 to be explained later with reference to FIG. 14, the thermal stress between the semiconductor chip and the capacitor 20 or the thermal stress between the capacitor 20 and the substrate is reduced.

Further, it should be noted that the support body 21 of organic polysilane film has a Young modulus of 1.2 GPa, a dielectric constant of 2.8, a dielectric loss tangent of 0.005, and an insulation performance of $3–7 \times 10^{13}$.

Next, the manufacturing method of the capacitor 20 will be explained with reference to FIGS. 2A–2H and 3A–3E.

In the present invention, the capacitor 20 is formed by forming the capacitor part 22 in large number on a large-size substrate in a row and column formation to form a layered body and dividing the layered body thus formed into individual capacitors.

Figure 2:
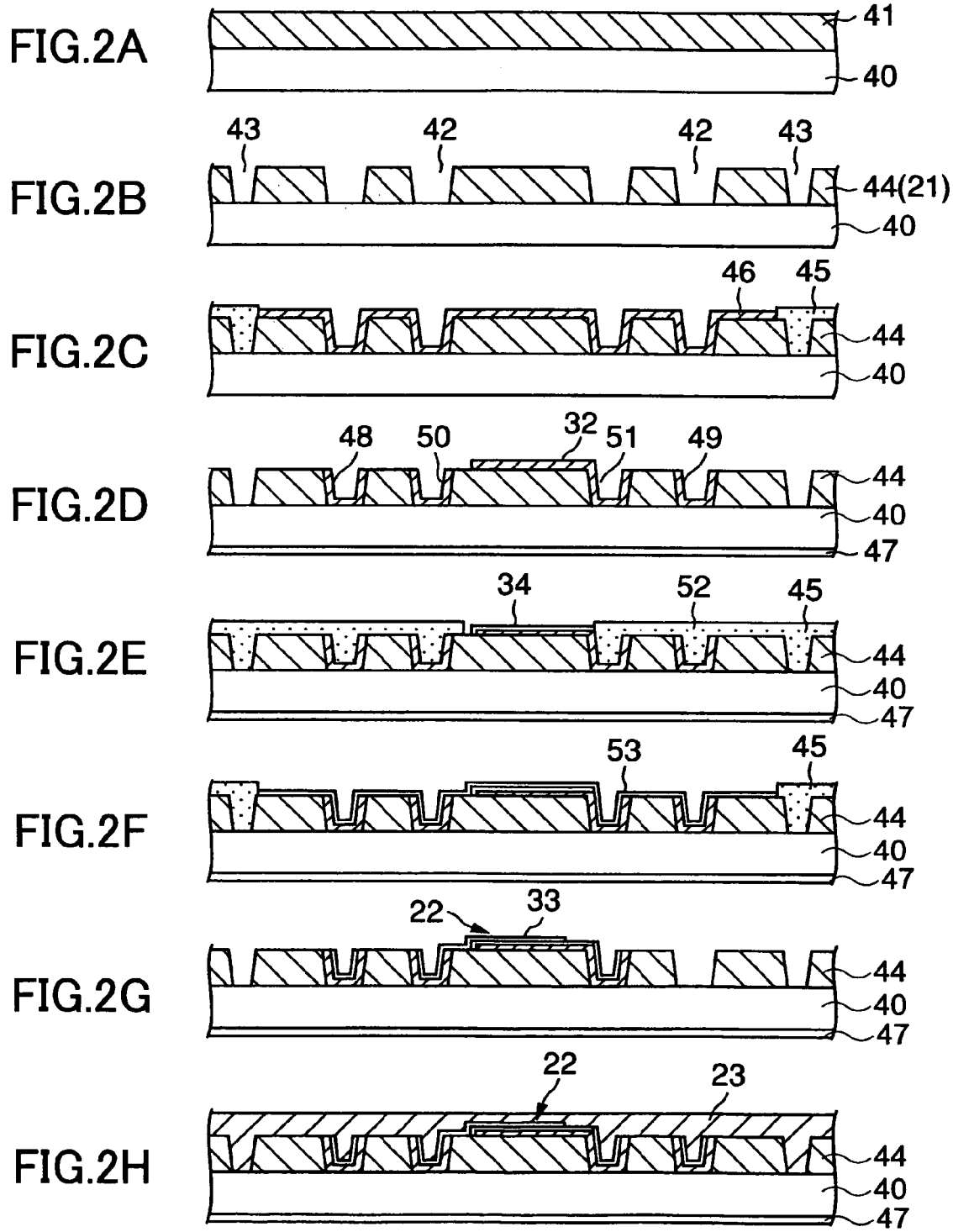
FIGS. 2A–2H are diagrams showing the manufacturing process of the capacitor of FIG. 1.

In the step of FIG. 2A, a layer 41 of organic polysilane is formed on a top surface of a base 40.

Preferably, the base 40 is formed of a material that can be removed by etching and can endure the temperature of about 500° C. Typically, a copper sheet is used for the base 40, although it is also possible to use an iron sheet. The organic polysilane layer 41 is formed by a spin coating process with a thickness of one to several ten microns, and the organic polysilane layer 41 thus formed is subjected to a prebaking process at 120° C. for 10 minutes.

It should be noted that the organic polysilane layer 41 formed on the base 40 can endure the high temperature used in the process of forming the capacitor part 22.

Next, as represented in FIG. 2B, the prebaked organic polysilane layer is exposed and developed to form grooves 43 in the form of a grid and further via-openings 42 such that the via-openings and the grooves 43 reach the base 40.

After this, a post-baking process is conducted and the organic polysilane layer 41 is converted to a post-baked organic polysilane layer 44, wherein it should be noted that the post-baked organic polysilane layer 44 constitutes the foregoing support body 21.

In the foregoing process, it should be noted that the exposure is conducted with an exposure dose of 5 J/cm2 at the wavelength of 310 nm and the development is conducted by using an alkaline developing solution. The post-baking process is conducted at 230° C. for 60 minutes.

It should be noted that the post-baked organic polysilane layer 44 has a thermal expansion coefficient intermediate between the thermal expansion coefficient of the substrate for the semiconductor device itself and the thermal expansion coefficient of silicon, and thus has a value closer to the thermal expansion coefficient of the semiconductor chip mounted on the substrate.

In the case the post-baking process has been conducted at the temperature exceeding 500° C., the organic polysilane is fully converted to inorganic $SiO_2$ and the thermal expansion coefficient of the support body 21 becomes very close to the thermal expansion coefficient of silicon constituting the semiconductor chip. Thus, the organic polysilane support body of the present invention also includes an inorganic layer fully converted as a result of the post-baking process.

Next, in the step of FIG. 2C, the grooves 43 in the post-baked organic polysilane layer 44 is masked by a resist film 45 and titanium is sputtered in this state, followed by sputtering of tantalum to form a metal layer 46 on the surface of the post-baked organic polysilane layer 44, including the bottom and sidewall of the via-openings 42.

Alternatively, it is possible to apply electroless plating or sputtering of copper on the surface of the post-baked organic polysilane layer and form a copper layer by conducting an electrolytic plating process before forming the layers of titanium and tantalum. By forming such a copper layer, it becomes possible to reduce the resistance of the lower electrode 32.

Next, in the step of FIG. 2D, the bottom surface of the base40 is covered with a resist film 47 and the metal layer 46 is etched while using the resist film 47 as a mask. With this, the lower electrode 32 and via-contacts 48–51 are formed.

Next, as shown in FIG. 2E, the top surface is covered with a resist film 52 except for the lower electrode 32, and an anodic oxidation process is conducted on the top surface of the lower electrode 32. With this, an anodic oxidation layer 34 is formed on the top surface of the lower electrode 32, and the anodic oxidation layer 34 consists of $Ta_2O_5$. The anodic oxidation layer 34 thus formed constitutes the capacitor dielectric film in the capacitor part 22.

Typically, the anodic oxidation process is conducted while using a sodium citrate of 0.1% concentration for the electrolytic solution by supplying a constant current of 11.0 mA/cm until a formation voltage of 200V is reached.

Next, as represented in FIG. 2F, the resist film 52 is removed while leaving the resist film 45 covering the grooves 43 as it is, and a sputtering of chromium is conducted, followed by sputtering of copper. Thereby, a metal layer 53 is formed.

Next, in the step of FIG. 2G, the metal layer 53 is etched and the upper electrode 33 is formed as a result. After this, the resist film 45 is removed.

Next, as represented in FIG. 2H, the insulation layer 23 is formed by applying an epoxy resin to the structure of FIG. 2G.

It is possible to use a polyamide film for the insulation layer 23. In this case, the polyamide film is applied in place of the epoxy resin film. Further, it is also possible to sputter a silicon oxide film or silicon nitride film. Further, the insulation layer 23 may be formed by baking organic polysilane, similarly to the case of the support body 21.

Figure 3:
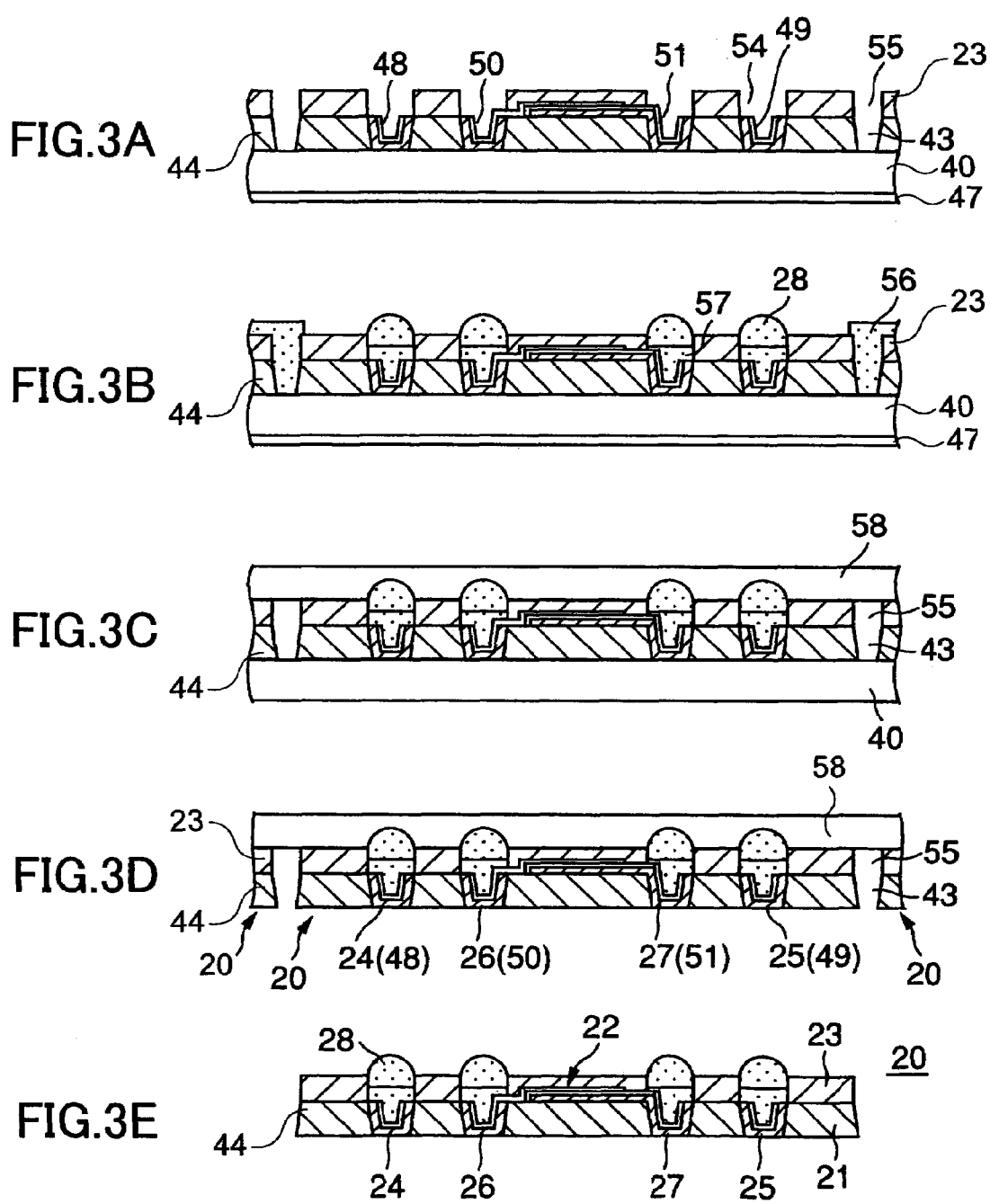
FIGS. 3A–3E are diagrams showing the manufacturing process of the capacitor of FIG. 1 following the step of FIG. 2H.

Next, as represented in FIG. 3A, the part of the insulation layer 23 filling the via-openings 42 and the grid-shaped grooves 43 by laser irradiation or etching, and openings 54 and grooves 53 are formed such that the via-contacts 48–51 and the grooves 43 are exposed.

In the case a photosensitive film is used for the insulation layer 23 in place of the epoxy film, the openings 54 and the grooves 55 are formed by exposure and developing process.

Next, as represented in FIG. 3B, the grooves 43 and 55 are filled with a resist film 56, and the via-contacts 48–51 are filled with copper by conducting an electrolytic plating process, wherein the electrolytic plating process is conducted by supplying a current from the base 40 to the via-contacts 48–51. After the via-contacts 48–51 are thus filled with copper, solder bumps 28 are formed by conducting an electrolytic plating process of solder alloy such that the solder bumps 28 projects from the surface of the insulation layer 23.

Of course, it is possible to attach solder balls on the via-contacts 48–51 and cause reflowing to form the solder bumps 28.

Next, as represented in FIG. 3C, the resist film 56 is removed and a tacking tape 58 is attached to the surface of the insulation layer 23 with a size sufficient to cover the entire surface of the base 40, and the resist film 47 is removed from the bottom surface of the base 40. In FIG. 3C, it should be noted that the tacking tape 58 extends across the grooves 55 and 43.

Next, in the step of FIG. 3D, the copper base 40 is removed by etching.

With this, the bottom surface of the post-baked organic polysilane layer 44 is exposed. Thereby, the via-contacts 48–51 are also exposed at the bottom surface of the post-baked organic polysilane layer 44, and the via-contacts 48–51 thus exposed form the signal terminals 24 and 25, the power terminal 26 and the ground terminal 27.

In the state of FIG. 3D, it should be noted that the individual capacitors 20 are separated from each other by the exposed grooves 43 and 55, while the capacitors 20 thus separated from each other are held together in the original row and column formation on the tacking tape 58.

In the foregoing process of the present embodiment, it should be noted that the capacitors 20 are separated from each other without conducting a dicing process.

By picking up the capacitors 20 thus separated form each other from the tape 58, the capacitor 20 of FIG. 1 is obtained as represented in FIG. 3E.

SECOND EMBODIMENT

Figure 4:
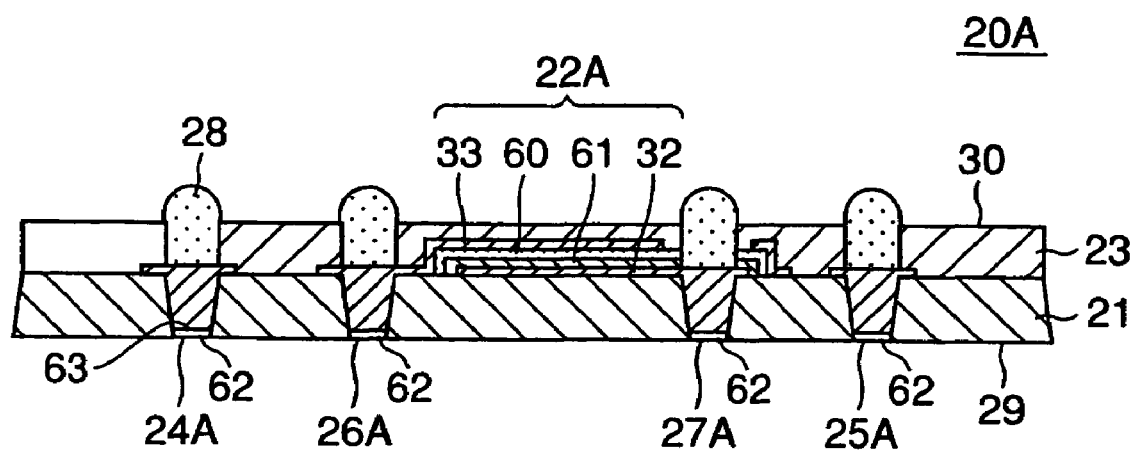
FIG. 4 is a diagram showing the construction of a capacitor according to a second embodiment of the present invention.

FIG. 4 shows the construction of a capacitor 20A according to a second embodiment of the present invention, wherein the capacitor 20A has a construction similar to that of the capacitor 20 except for the capacitor part and the terminals. Thus, those parts of FIG. 4 corresponding to the parts of FIG. 1 are designated by the same reference numerals and the description thereof will be omitted.

Referring to FIG. 4, the capacitor 20A has a size similar to the size of the semiconductor chip and includes a capacitor part 22A formed on the top surface of the support body 21 formed of the organic polysilane film. The capacitor part 22A is covered by the insulation film 23 formed on the support body 21, and signal terminals 24A and 25A, a power terminal 26A and a ground terminals 27A are exposed at the bottom surface of the support body 21. Further, solder bumps 28 are provided so as to project from the insulation layer 23.

The capacitor part 22A of the present embodiment has a construction in which a tantalum layer 61 carrying thereon an anodic oxide layer 60 is sandwiched between the lower electrode 32 and the upper electrode 33.

Further, each of the signal terminals 24A and 25A, the power terminal 26A and the ground terminal 27A has a construction including a barrier layer 62 and a seed layer 63.

Next, the manufacturing process of the capacitor 20A will be explained with reference to FIGS. 5A–5H and 6A–6F, wherein FIGS. 5A–5D correspond respectively to the steps of FIGS. 2A–2D explained before and FIGS. 5F–5G correspond respectively to the steps of FIGS. 2E–2G explained before. Further, FIG. 6A corresponds to FIG. 2H and FIGS. 6B–6E correspond respectively to the steps of FIGS. 3A–3D.

In the steps of FIGS. 5A and 5B, the layer 41 of organic polysilane is formed on the base 40 and the via-openings 42 and the grooves 43 of matrix shape are formed in the layer 41. Further, a post-baking process is conducted.

Next, as represented in FIG. 5C, the exposed surface of the base 40 exposed at the bottom of the via-openings 42 are covered with a barrier layer 62 by conducting electrolytic plating process of gold and nickel consecutively. As will be explained later, this barrier layer 62 is used to prevent the interconnection pattern from being dissolved at the time of removal of the pad connecting the bumps of the semiconductor chip or the base 40 by conducting an etching process.

Next, a seed layer 63 is formed by conducting an electroless copper plating process such that the seed layer 63 covers the post-baked organic polysilane layer 44, the barrier layer 62 and the sidewall surface of the via-openings 42. This seed layer 63 may be formed also by conducting sputtering of chromium, followed by sputtering of copper.

Next, an electrolytic plating process of copper is conducted while using the seed layer 63 as a current feeding layer, and there is formed a metal layer 64 such that the metal layer covers the post-baked organic polysilane layer 44 and fills the via-openings 42.

Next, as represented in FIG. 5D, the metal layer 64 is etched, and the remaining part of the metal layer 64 constitutes the lower electrode 32 and via-contacts 48A–51A.

Next, as represented in FIG. 5E, a selective sputtering process is conducted and a tantalum layer 61 on the lower electrode 32 as the metal layer used for forming the capacitor dielectric film.

In place of the selective sputtering process, it is also possible to supper tantalum on the entirety of the post-baked organic polysilane layer 44 and the lower electrode 32. In this case, the tantalum layer thus formed is patterned subsequently by etching, such that the tantalum layer remains only on the lower electrode 32.

Further, it is possible to form a titanium layer first and form the tantalum layer 61 on such a titanium layer.

Next, in the step of FIG. 5F, the top surface of the tantalum layer 61 is subjected to anodic oxidation process and an anodic oxide layer ($Ta_2O_5$) 60 is formed on the top surface of the tantalum layer 61. The anodic oxidation process is conducted similarly to the case of FIG. 2E.

Next, as represented in FIG. 5G, a metal layer 53A is formed, wherein the metal layer 53A is formed by removing the resist film 52 while leaving the resist film 45 at the grooves 43 and by forming a seed layer on the surface and conducting an electrolytic plating process of copper while using the seed layer as a current feeding layer. This seed layer may be formed by conducting an electroless plating process. Alternatively, the seed layer may be formed by conducing sputtering of chromium and copper consecutively. Further, it is possible to form the metal layer 53A by sputtering of chromium and copper.

Next, as represented in FIG. 5H, the metal layer 53 is patterned by etching and the upper electrode 33 and pads 65 are formed, wherein it should be noted that the pads 65 are formed on the top surfaces of the via-contacts 48A, 49A and 50A. Further, the part of the anodic oxide layer 60 and the tantalum layer 61 corresponding to the via-contact 51A is removed by etching to form an opening 66, such that the top surface of the via-contact 51A is exposed.

Figure 6A:
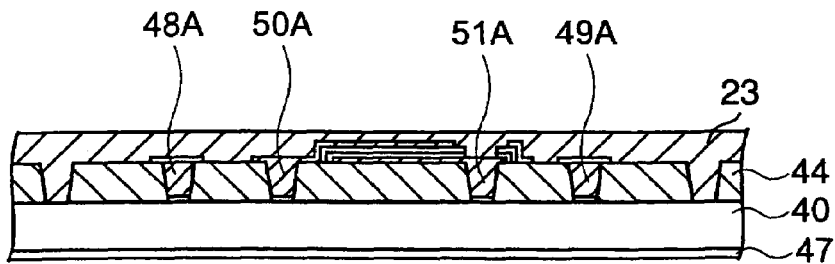
FIGS. 6A–6F are diagrams showing the manufacturing process of the capacitor of FIG. 4 following the step of FIG. 5H.
Figure 6B:
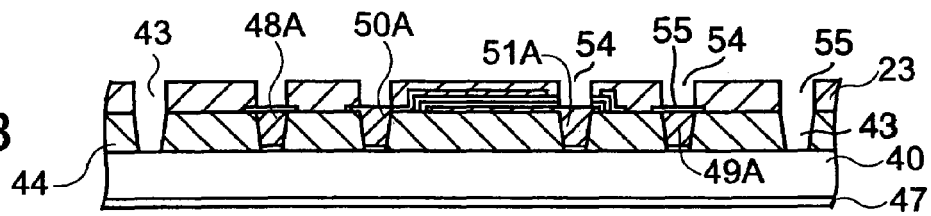

Next, as represented in FIG. 6A, the insulation layer 23 is formed on the structure of FIG. 5H, wherein the insulation layer 23 thus formed is further formed with openings 54 and grooves 55 as represented in FIG. 6B, such that the via-contacts 48A–51A, the pad 65 and the grooves 43 are exposed.

Figure 6C:
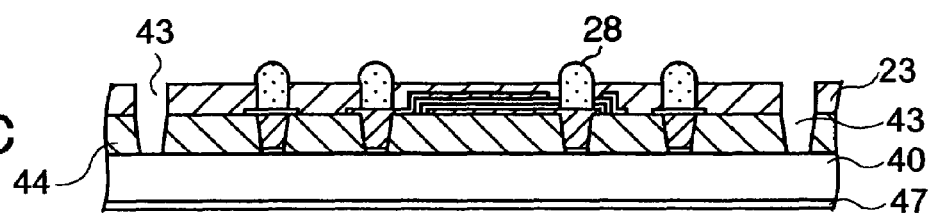

Next, as represented in FIG. 6C, solder bumps 28 are formed by conducting an electrolytic plating process of solder alloy such that the solder bumps 28 projects from the insulation layer 23 by feeding electric current to each of the via-contacts 48A–51A from the base 40.

Figure 6D:
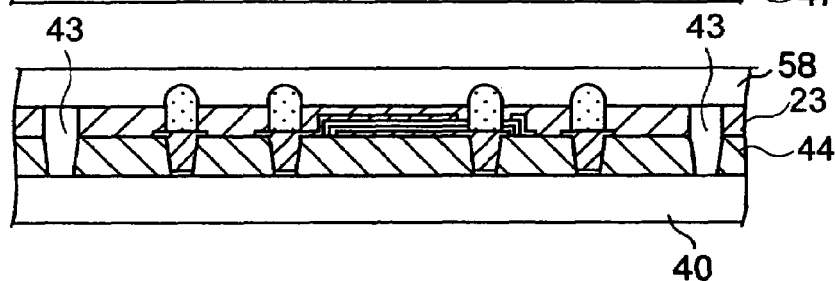
Figure 6E:
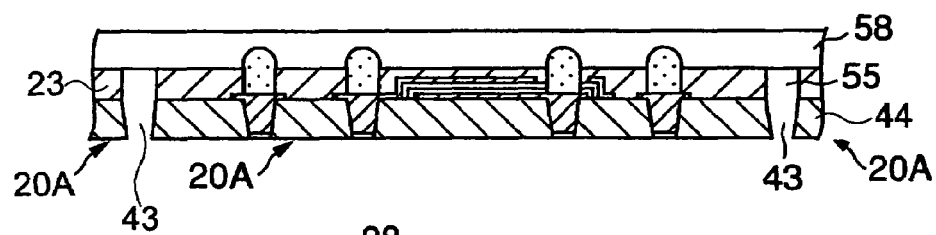

Next, as represented in FIG. 6D, a tacking tape 58 is attached to the surface of the insulation layer 23 and the base 40 of copper is removed by etching as represented in FIG. 6E. With this, the capacitors 20A are separated from each other.

Figure 6F:
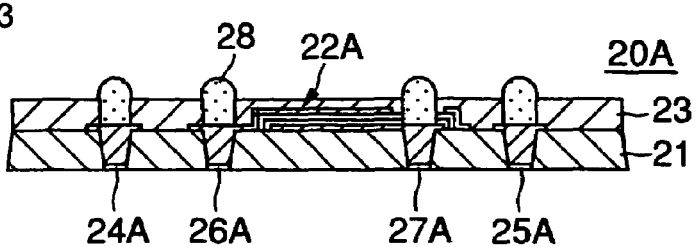

Further, by picking up the separated capacitors 20 from the tacking tape 58, the capacitor 20A of FIG. 4 is obtained as represented in FIG. 6F.

In this embodiment, it should be noted that the variations explained with reference to FIGS. 2A–2H and 3A–3D can also be used.

THIRD EMBODIMENT

Figure 7A:
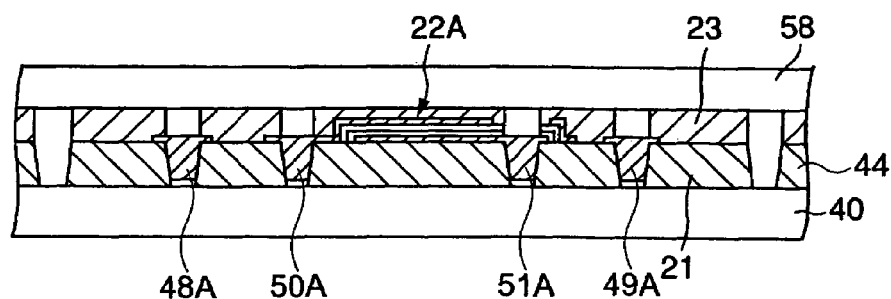
FIGS. 7A–7C are diagrams showing the manufacturing process of a capacitor according to a third embodiment of the present invention.
Figure 7B:
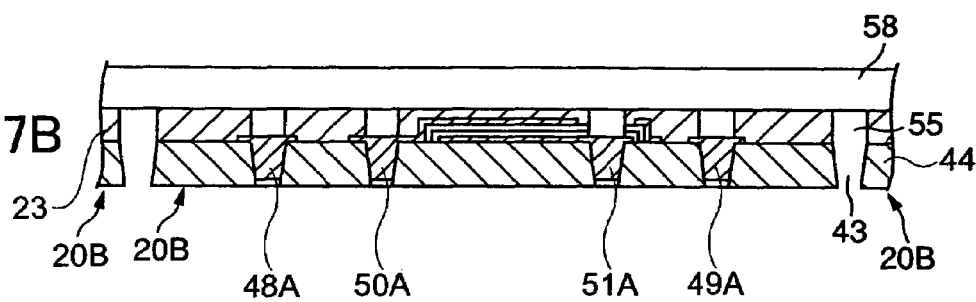
Figure 7C:
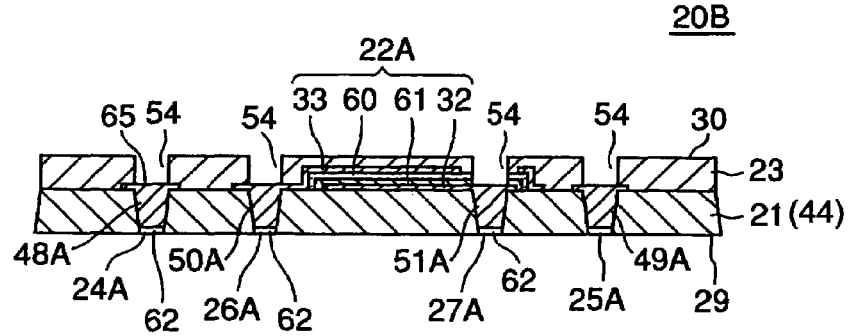

FIG. 7C shows the construction of a capacitor 20B according to a third embodiment of the present invention.

Referring to FIG. 7C, the capacitor 20B has a structure similar to that of the capacitor 20A of FIG. 4 except that the solder bumps 28 are not provided. In FIGS. 7A–7C, those parts corresponding to the parts described previously are designated by the same reference numerals and the description thereof will be omitted.

The capacitor 20B has a size identical with the size of the semiconductor chip and includes a support body 21 of organic polysilane film and a capacitor part 22A formed on the support body 21. Further, the insulation layer 23 covers the capacitor part 22A on the support body 21 and the signal thermals 24A, 25A, power terminal 26A and the ground terminal 27A are exposed at the bottom surface of the support body 21. The insulation layer 23 is formed with the opening 54 such that the opening 54 exposes the pad 65 at the bottom thereof.

It should be noted that the capacitor 20B is formed by attaching the tape 58 on the surface of the insulation layer 23 in the step of FIG. 6B as represented in FIGS. 7A and 7B and by removing the base 40 of copper by an etching process in this state.

FOURTH EMBODIMENT

Figure 8:
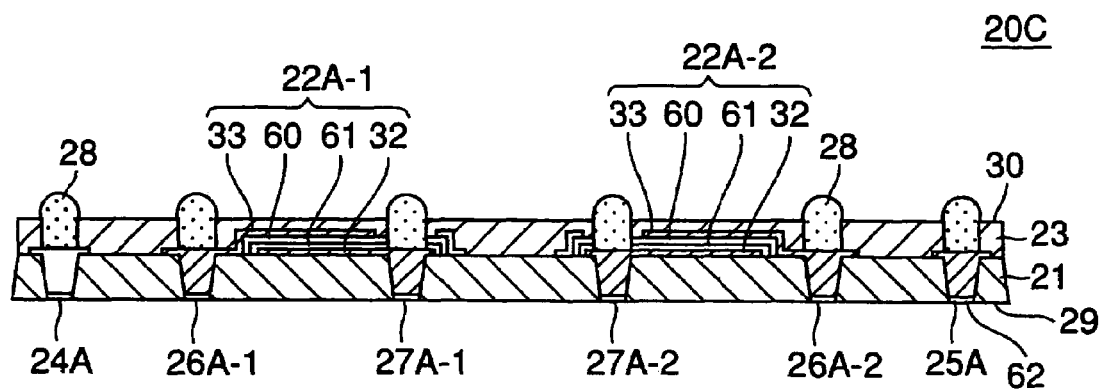
FIG. 8 is a diagram showing the construction of a capacitor according to a fourth embodiment of the present invention.

FIG. 8 shows the construction of a capacitor 20C according to a fourth embodiment of the present invention.

The capacitor 20C has a construction similar to that of the capacitor 20A of FIG. 4 except that two capacitor parts are provided side by side. In the drawing, those parts corresponding to the parts described previously with reference to FIG. 4 are designated by the same reference numerals and the description thereof will be omitted.

It should be noted that the capacitor 20C has a size identical with the size of the semiconductor chip and includes capacitor parts 22A-1 and 22A-2 supported on the support body 21 of organic polysilane film. The capacitor parts 22A-1 and 22A-2 are covered with the insulation layer 23 on the top surface of the support body 21, the signal electrodes 24A and 25A, power terminals 26A-1 and 26A-2, and ground terminals 27A-1 and 27A-2 are formed on the bottom surface of the support body 21. Further, solder bumps 28 projects from the top surface of the insulation layer 23. It should be noted that the capacitor part 22A-1 is provided between the power terminal 26A-1 and the ground terminal 27A-1, while the capacitor part 22A-2 is provided between the power terminal 26A-2 and the ground terminal 27A-2.

FIFTH EMBODIMENT

Figure 9:
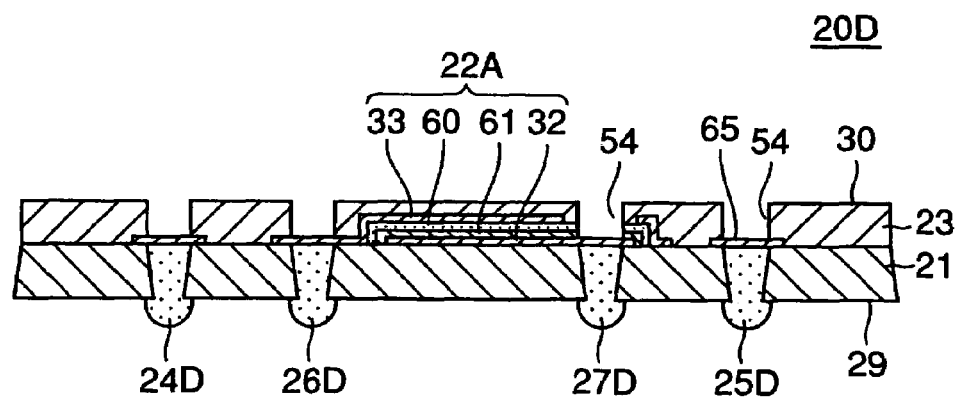
FIG. 9 is a diagram showing the construction of a capacitor according to a fifth embodiment of the present invention.

FIG. 9 shows a capacitor 20D according to a fifth embodiment of the present invention.

Referring to FIG. 9, the capacitor 20D has a construction similar to that of the capacitor 20A shown in FIG. 4 except that the capacitor 20D lacks the solder bumps 28 and the terminals form bumps. In FIG. 9, those parts corresponding to the parts described previously are designated by the same reference numerals and the description thereof will be omitted.

Referring to FIG. 9, the capacitor 20D has a size equal to the size of the semiconductor chip mounted thereon and has the construction in which the capacitor part 22A is formed on the support body 21 of organic polysilane film. The capacitor part 22A is covered by the insulation layer 23 on the top surface of the support body 21, and signal electrodes 24D and 25D, a power terminal 26D and a ground terminal 27D are exposed at the bottom surface of the support body 21. The insulation layer 23 is formed with the openings 54 such that the openings 54 expose the pads 65 at the bottom part thereof.

Next, the manufacturing method of the capacitor 20D will be explained with reference to FIGS. 10A–10F and FIGS. 11A–11D.

It should be noted that the capacitor 20D is manufactured in the reverse order of the case of the capacitor 20 or 20A, and the terminals 24D–27D are formed first. Thereafter, the capacitor part 22A is formed.

Figure 10A:
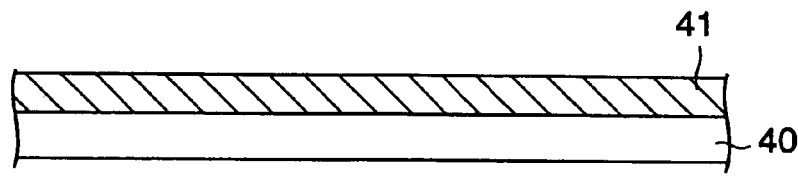
FIGS. 10A–10F are diagrams showing the manufacturing process of the capacitor of FIG. 9.
Figure 10B:
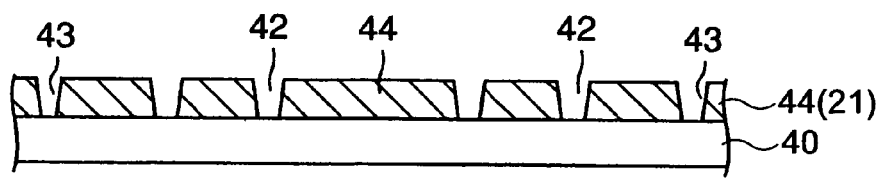

First, the organic polysilane layer 41 is formed on the base 40 and pre-baked in the step of FIG. 10A, and the via-openings 42 and the grid-shaped groves 43 for device separation are formed in the organic polysilane layer 41 in the step of FIG. 10B. Thereafter, the post-baking process is conducted.

Figure 10C:
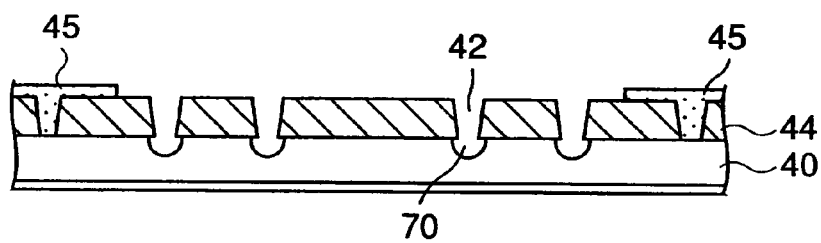

Next, in the step of FIG. 10C, the grooves 43 in the post-baked organic polysilane layer 44 are masked by the resist film 45 and the base 40 exposed at the bottom of the via-openings 42 is removed by etching. Thereby, depressions 70 are formed in the base 40 in correspondence to the via-openings 42, wherein the depressions 70 correspond to the bumps to be formed later.

Figure 10D:
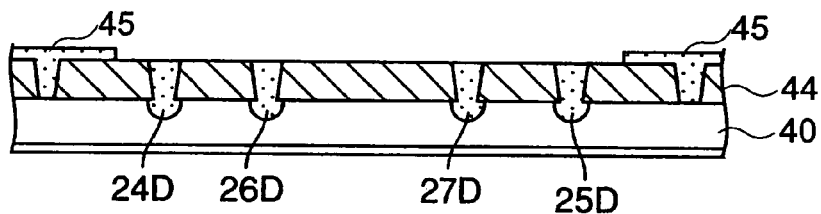

Next, as represented in FIG. 10D, electroplating of solder alloy is conducted by feeding a current from the base 40 such that the solder alloy fills the depressions 70 and the via-openings 42. With this, the signal terminals 24D and 25D, the power terminal 26D and the ground terminal 27D are formed.

Figure 10E:
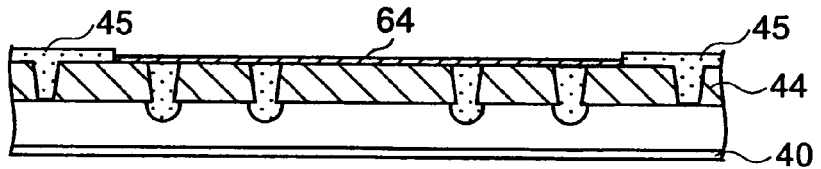

Next, as represented in FIG. 10E, a seed layer is formed on the post-baked organic polysilane layer 44 similarly to the step of FIG. 5C and an electroplating of copper is conducted while using the seed layer as the current feed layer. As a result, the metal layer 64 is formed.

Figure 10F:
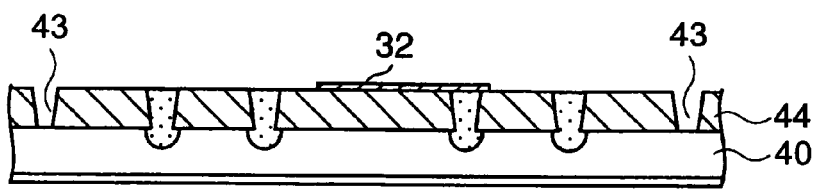

Next, in the step of FIG. 10F, the metal layer 64 is patterned by etching, and the remaining part of the metal layer 64 forms the lower electrode 32.

Thereafter, the steps corresponding to the steps similar to those of FIGS. 5E–5H and FIG. 6A are conducted, and the capacitor part 11A, the insulation layer 23 and the openings 54 are formed as represented in FIG. 11A.

Next, as represented in FIG. 11B, the tacking tape 58 is attached to the surface of the insulation layer 23 and the base 40 of copper is removed by etching as represented in FIG. 11C. With this, individual capacitors 20D are separated from each other. Thus, by picking up the individual capacitors 20D from the tacking tape 58, it is possible to obtain the capacitor 20D of FIG. 9 as represented in FIG. 11D.

Further, it should be noted that various variations explained with reference to FIGS. 5A–5H and 6A–6F can be applied also in the present embodiment.

In the capacitor 20 and the capacitors 20A–20D, it should be noted that the capacitor part 22, 22A, 22A-1-22A-2 can be formed to have a film of ferroelectric such as barium titanate or strontium titanate on the top surface of the lower electrode 32 in place of the anodic oxide layer 34 or 60. In this case, the ferroelectric film can be formed by a PVD process such as sputtering or CVD process. Alternately, the ferroelectric film can be formed by a sol-gel process.

Further, in the capacitor 20 and the capacitors 20A–20D, it is possible to use a liquid crystal polymer for the support body 21 in place of the organic polysilane film.

Further, in the capacitor 20 and the capacitors 20A–20D, it is possible to separate the individual capacitors not by forming the grid-shaped grooves 43 but by conducting a dicing process.

Further, in the capacitor 20 and the capacitors 20A–20D, it is possible to form a resistance in addition to the capacitor by forming an anodic oxide layer or ferroelectric layer within an interconnection pattern.

Next, description will be made on a substrate for mounting a semiconductor chip and the manufacturing method thereof.

Figure 12:
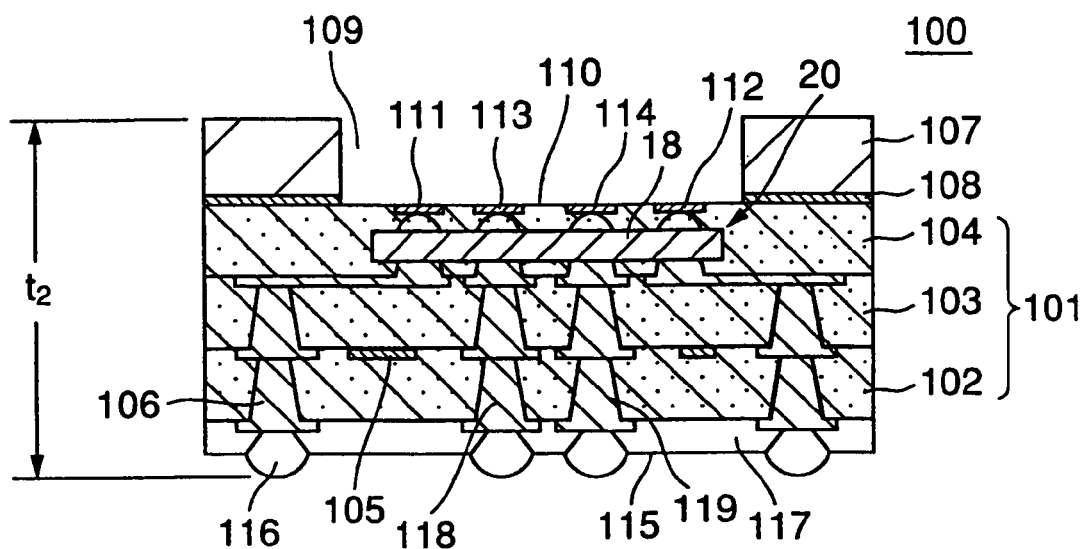
FIG. 12 is a diagram showing the construction of a substrate for mounting a semiconductor chip according to an embodiment of the present invention.
Figure 13:
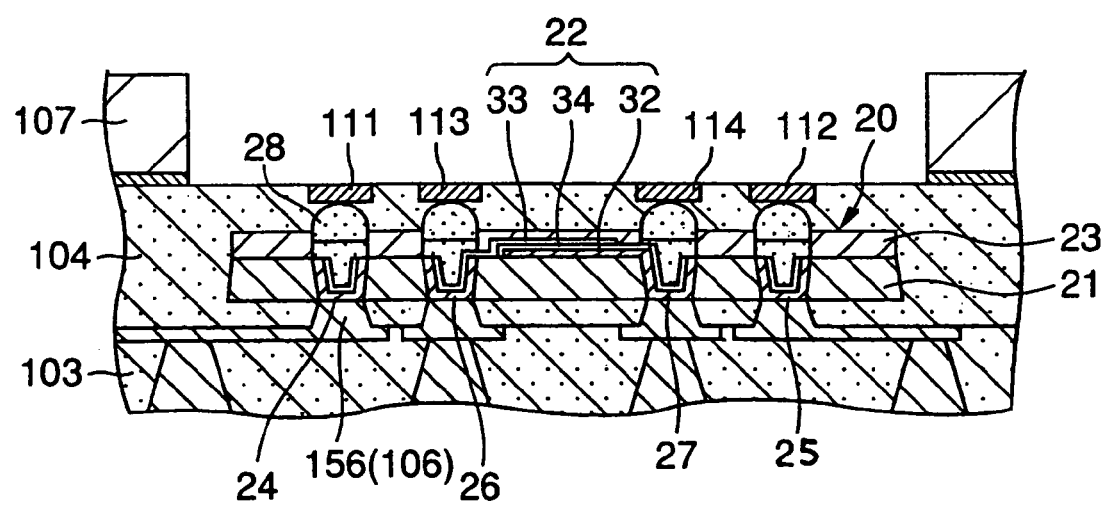
FIG. 13 is a diagram showing a part of FIG. 12 in an enlarged view.

FIG. 12 shows the construction of a substrate 100 of the present embodiment on which a semiconductor chip is mounted, while FIG. 13 shows a part of the substrate 100 in an enlarged scale.

Referring to the drawings, the substrate 100 includes a substrate body 101 and the capacitor 20 of FIG. 1, wherein the substrate body 101 is a multilayer circuit substrate in which resin layers 102, 103 and 104 are laminated. Each of the layers 102, 103 and 104 carries a conductor pattern 105, wherein the conductor patterns 105 of different layers are connected electrically by via plugs 106 penetrating through each layer. Further, a metal frame 107 is provided on the substrate 101 for reinforcement, wherein the metal frame 107 is attached to the substrate 101 by a thin resin layer 108.

The substrate 108 has a chip-mounting surface 110 on which a semiconductor chip is mounted in a face down state, and there are formed signal terminals 111 and 112, a power terminal 113 and a ground terminal 114 in the area of the substrate body 101 surrounded by the metal frame 107 in the state that the terminals are exposed at the top surface of the substrate body 101. Further, the substrate body 101 has a mounting surface 115 at the bottom surface thereof, wherein solder balls 116 are provided on the mounting surface 115 in connection with the via plugs 106. The mounting surface 115 is covered by a solder resist layer 117.

As represented in the enlarged view of FIG. 13, the capacitor 20 is embedded in the resin layer 104 in the substrate body 101 at the location immediately underneath the chip mounting surface 110. Thereby, it should be noted that the bumps 28 of the capacitor 20 are connected to the signal terminals 11 and 112, the power terminal 113 and the ground terminal 114. The signal terminals 24 and 25, the power terminal 26 and the ground terminal 27 of the capacitor 20 are connected to via-contacts 156. Thereby, the capacitor part 22 of the capacitor 20 is connected between a power feed conductor path 118 and a ground conductor path 119 provided in the substrate 100.

Here, it should be noted that the capacitor 20 has a reduced thickness and can be embedded in a single resin layer 104. Thus, the substrate 100 can be formed to have a correspondingly reduced thickness t2. It should be noted that the resin layer 104 has a thickness of several ten microns or more.

Figure 14:
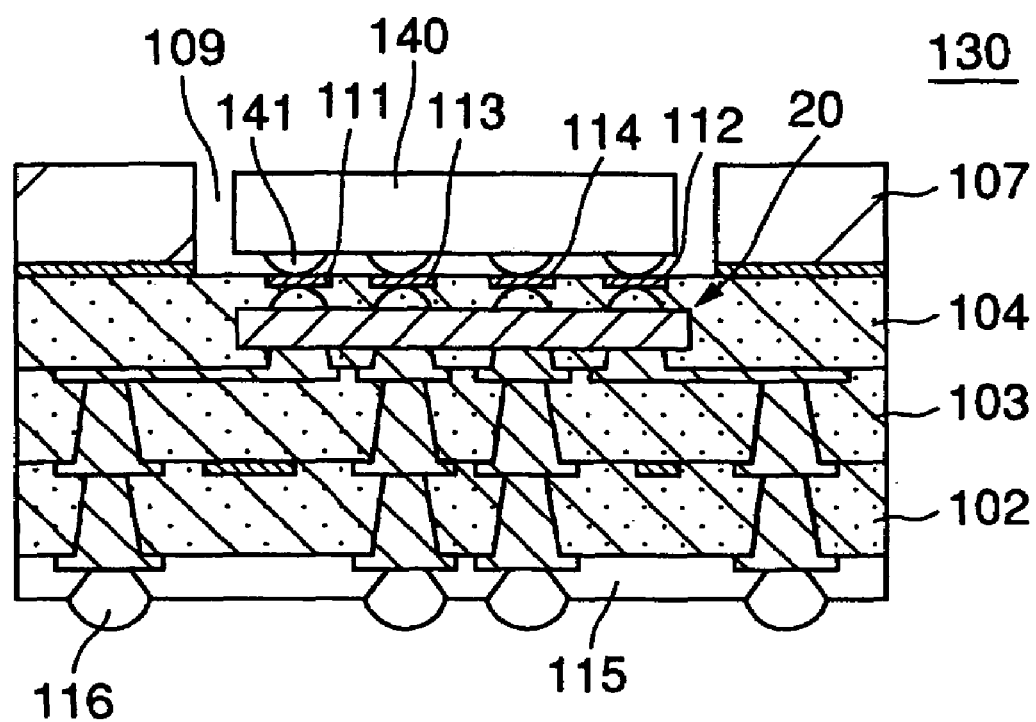
FIG. 14 is a diagram showing the construction of a semiconductor device that uses the substrate of FIG. 12.

FIG. 14 shows a semiconductor device 130.

Referring to FIG. 14, the semiconductor device 130 includes the substrate 100 of FIG. 12 and a semiconductor chip 140 flip-chip mounted on the chip-mounting surface 110 of the substrate 100. Thereby, it should be noted that bumps 141 at a bottom surface of the semiconductor chip 140 are connected to the signal terminals 111 and 112, the power terminal 113 and the ground terminal 114 exposed at the chip-mounting surface 110.

Here, it should be noted that the capacitor 20 is provided right underneath the chip mounting surface 110 of the substrate 100, and thus, the semiconductor chip 140 is mounted directly on the capacitor 20. Thus, the conductor path between the semiconductor chip 140 and the capacitor 20 is minimum, and thus, the inductance associated with this conductor path is minimized. Thus, a stable supply voltage is supplied to the semiconductor chip 140 even in the case the semiconductor chip 140 is driven at increased frequency, without experiencing the effect of this parasitic inductance.

Because of the construction in which the semiconductor chip 140 is mounted on the capacitor 20, and because of the construction that the capacitor 20 has the support body 21 of post-baked organic silane, the capacitor 20 has a thermal expansion coefficient generally equal to the thermal expansion coefficient of the semiconductor chip 140 formed of silicon. Thus, the thermal stress caused between the semiconductor chip 140 and the capacitor 20 is successfully minimized even in the case the capacitor 20 is heated as a result of the heat produced by the semiconductor chip 140 operating at a high speed.

Next, the manufacturing method of the substrate 100 will be explained with reference to FIGS. 15A–15E, 16A–16C and 17A–17C.

Figure 15A:
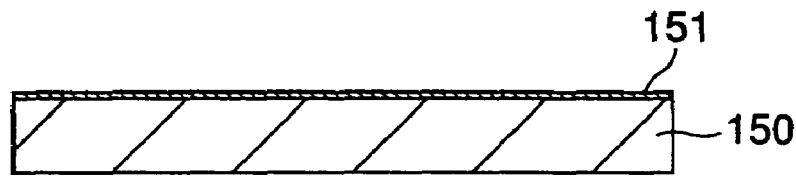
FIGS. 15A–15E are diagrams showing the manufacturing process of the substrate of FIG. 12.

First, a thin resin film 151 such as a polyamide film is formed on a top surface of a metal plate 150 such as a copper plate by applying the resin as represented in FIG. 15A.

Figure 15B:
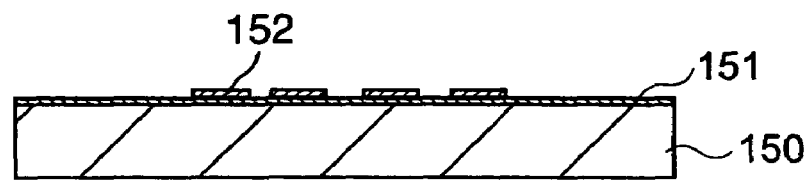

Next, as represented in FIG. 15B, a thin metal layer of copper, and the like is formed on the surface of the thin resin film 151 by an electroless plating process. Further, a metal film is formed on the foregoing thin metal layer by an electrolytic plating process while using the thin metal layer as a current feed layer. The metal layer thus formed is then patterned by a known patterning process such as photolithography, and interconnection pads 152 are formed as a result. It should be noted that the interconnection pads 152 thus formed includes signal terminals 111 and 112, a power terminal 113 and a ground terminal 114.

Figure 15C:
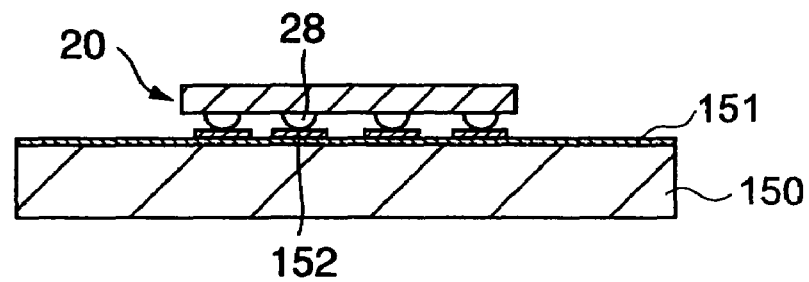

Next, as represented in FIG. 15C, the capacitor 20 of FIG. 1 is flip-chip mounted on the substrate 150 by turning over from the state of FIG. 1 such that the solder bumps 28 make an engagement with corresponding interconnection pads 152.

Figure 15D:
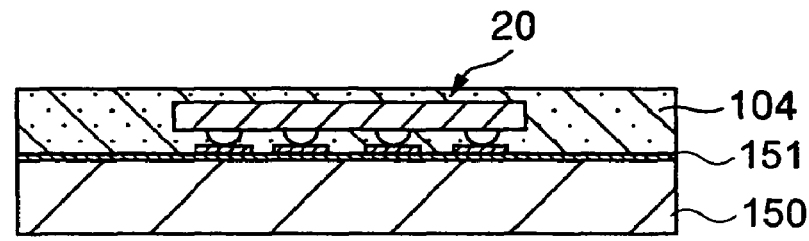

Next, as represented in FIG. 15D, a resin layer 104 such as an epoxy layer is laminated such that the resin layer 104 covers the capacitor 20 completely. It should be noted that the resin layer 104 thus formed fills the gap existing between the capacitor 20 and the thin resin film 151.

Figure 15E:
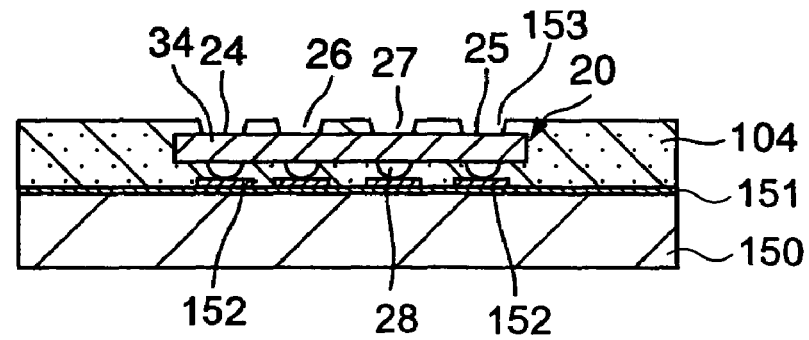

Next, as represented in FIG. 15E, depressions 153 are formed in the resin layer 104 by way of laser irradiation process or etching process for formation of via-opening, such that the depressions 153 expose the signal terminals 24 and 25, the power terminal 26 and the ground terminal 27 of the capacitor 20 at the bottom thereof.

Figure 16A:
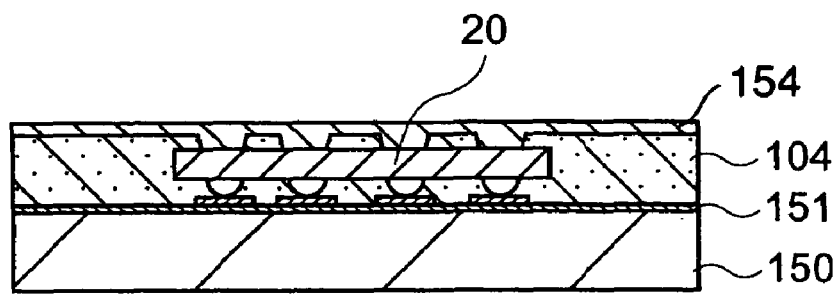
FIGS. 16A–16C are diagrams showing the process following the step of FIG. 15E.

Next, as represented in FIG. 16A, an electroless plating process of copper and an electrolytic plating process of copper are conducted and a metal layer 154 is formed on the entirely of the resin layer 104. It should be noted that the metal layer 154 thus formed fills the depressions 153.

Figure 16B:
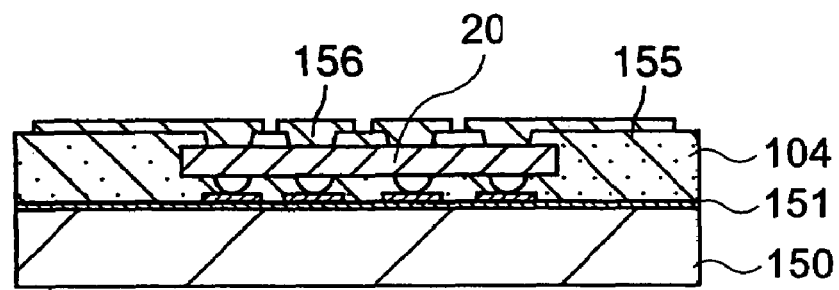

Next, in the step of FIG. 16B, the metal layer 154 is patterned by a photolithographic process and a conductor pattern 155 and via-contacts 156 are formed.

Figure 16C:
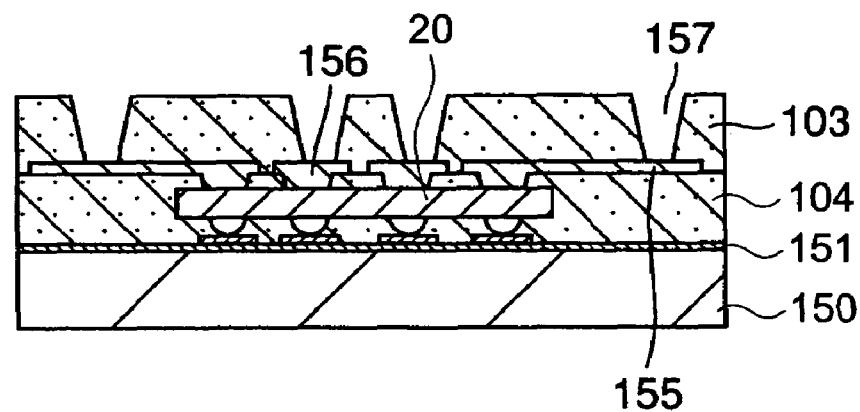

Next, as represented in FIG. 16C, the resin layer 103 is laminated such that the resin layer 103 covers the conductor pattern 155, and depressions 157 are formed in this resin layer 105 by laser irradiation process or etching process for the via-openings. Thereby, it should be noted that the depressions 157 expose the conductor pattern 155 and the via-contact 156 at the bottom part thereof.

Figure 17A:
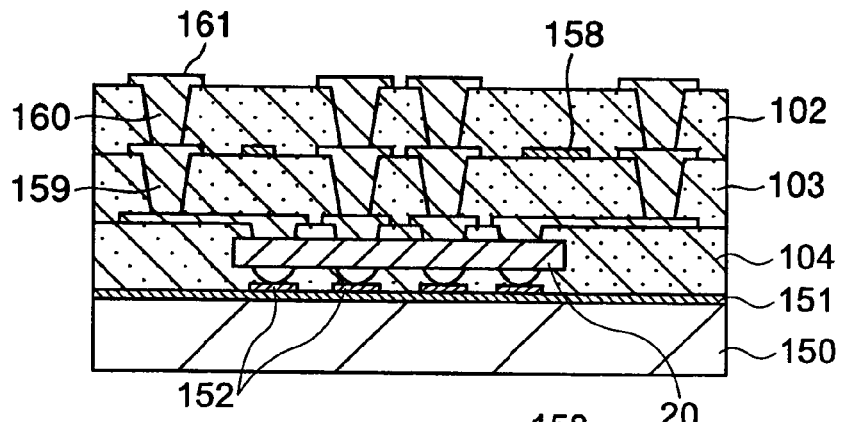
FIGS. 17A–17C are diagrams showing the manufacturing process of the substrate of FIG. 12 following the step of FIG. 16C.

Next, as represented in FIG. 17A, a metal layer is formed on the entirety of the resin layer 103 and a conductor pattern 158 and a via-contact 159 are formed by patterning the metal layer thus formed. Further, a resin layer 102 is laminated and a depression is formed in this resin layer 102 in correspondence to via-openings. Further, a metal layer is formed on the entirety of the resin layer 102 and via-contacts 160 and pads 161 are formed as a result of patterning of this metal layer.

Figure 17B:
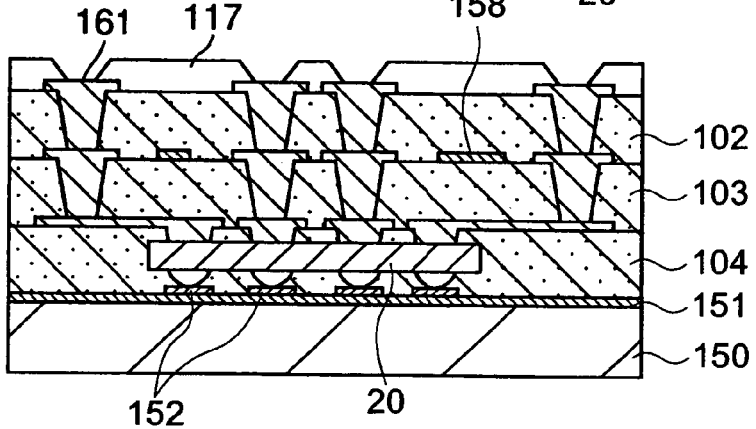

Next, as represented in FIG. 17B, a solder resist 117 is formed on the entire surface of the resin layer 102 except for the part where the pads 161 are formed.

Figure 17C:
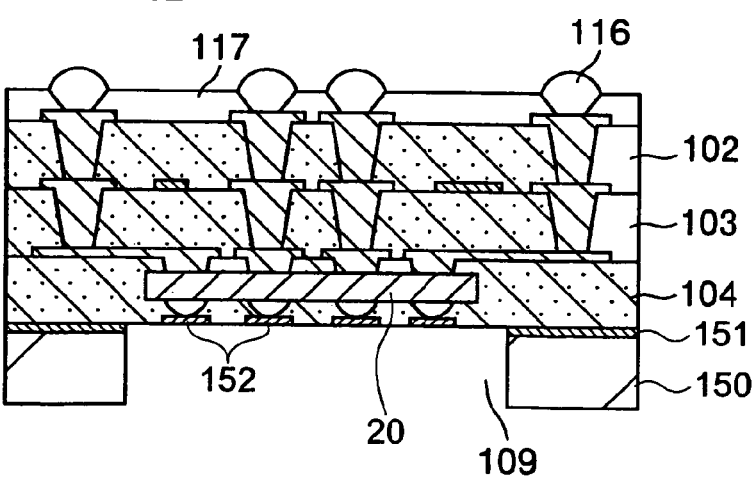

Finally, as represented in FIG. 17C, an etching process is conducted on the metal plate 150 to form a window 109, and the thin resin layer 151 exposed at the bottom of the window 109 is removed by an etchant that selectively acts on the resin layer 151. Further, solder balls 116 are attached to the pads 161. In the step of FIG. 17C, it is also possible to remove the metal plate 150 entirely.

Here, it should be noted that the etching reaction to the metal plate 150 is blocked by the thin resin layer 151, and there occurs no problem of excessive etching. Further, the attachment of the solder balls 116 to the pads 161 is conducted by placing the solder balls 116 in the depressions formed in the solder resist 117 and causing reflowing in this state.

It should be noted that any of the capacitor 20A of FIG. 4, the capacitor 20C of FIG. 8 and the capacitor 20D of FIG. 9 can be used similarly to the capacitor 20, wherein the capacitor is embedded inside the substrate at the location right underneath the chip-mounting surface. In the case of the capacitor 20D of FIG. 9, the bump terminals 24D–27D are used for connecting the capacitor 20D to the connection pads 152.

Next, a substrate integrated with the capacitor 20B of FIG. 7C will be described.

FIG. 18D shows the construction of a substrate 200 in which the capacitor 20B is integrated. The substrate 200 is manufactured according to the process steps shown in FIGS. 18A–18C.

First, a thin resin film 202 is formed on a metal plate 201 by applying a resin such as polyamide. In the state the polyamide layer is half cured, the capacitor 20B of FIG. 7C is attached to the foregoing thin resin film 202, and the resin film 202 is cured in this state. The resin film 202 functions similarly to an adhesive.

Next, as represented in FIG. 18B, buildup layers 203 and 204 are formed so as to cover the capacitor 20.

Next, as represented in FIG. 18C, the metal plate 201 is removed by etching to form a window 205. It is also possible to remove the metal plate 201 entirely.

Finally, etching or ashing is conducted and the thin resin film 202 exposed at the bottom of the window 205 is removed. With this, the substrate 200 for carrying a semiconductor chip is obtained.

In the substrate 200, it should be noted that a flat surface 29 of the capacitor 20B is exposed at the bottom of the window 205, and the signal terminals 24A and 25A, the power terminal 26A and the ground terminal 27A are exposed at the bottom of the window 205. Here, the flat surface 29 becomes the chip-mounting surface, and the terminals 24A, 25A, 26A and 27A function as the terminals for electrical connection of the semiconductor chip.

Figure 19:
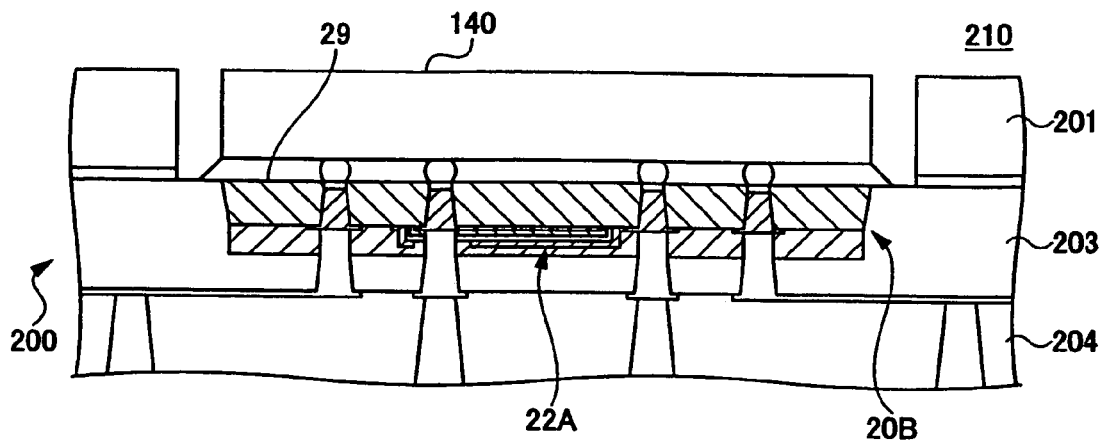
FIG. 19 shows the construction of a semiconductor device having a substrate of FIG. 18D.
Figure 20:
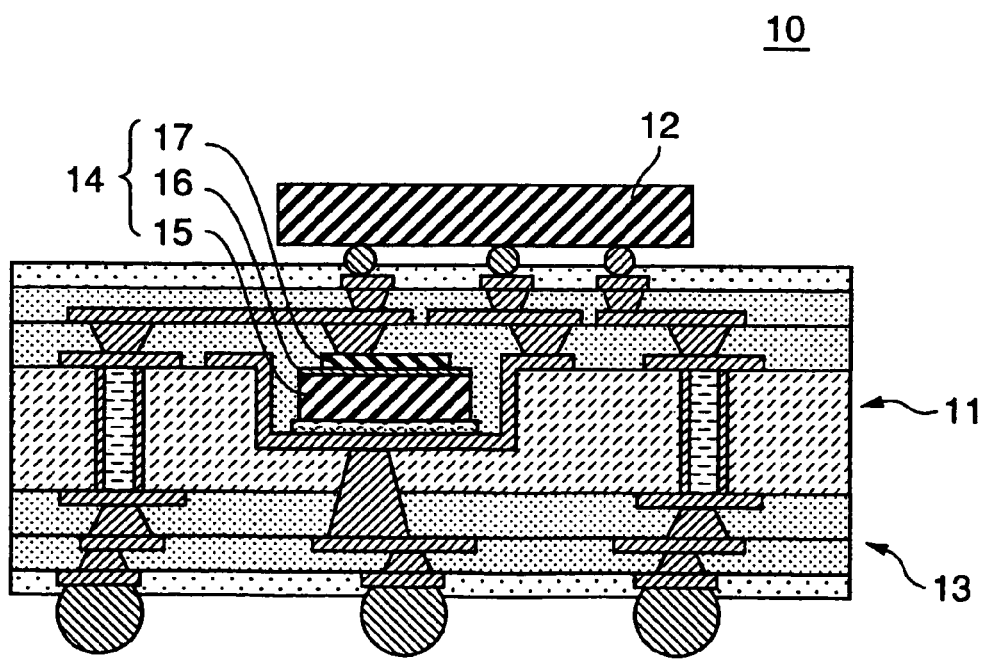
FIG. 20 is a diagram showing the construction of a conventional semiconductor device.

FIG. 19 shows a semiconductor device 210 having the substrate 200 of FIG. 18D.

Referring to FIG. 19, it can be seen that the semiconductor chip 140 is flip-chip mounted on the substrate 200, wherein the semiconductor chip 140 is mounted on the chip-mounting surface 29 in the state that the bump electrodes thereof are connected to the terminals 24A, 25A, 26A and 27A.

It should be noted that the capacitor 20, 20A–20D can be embedded also in other substrates for other applications.

Further, the present invention is not limited to the embodiments described heretofore, but various variations and modifications may be made without departing from the scope of the invention.

What is claimed is:

1. A method of manufacturing a capacitor including a capacitor part in which a dielectric film is sandwiched by a pair of electrodes and a support body of an organic polysilane film supporting said capacitor part, comprising the steps of:

forming a layer of organic polysilane on a surface of a base material;

forming a first electrode on said layer of organic polysilane;

forming a dielectric film on said first electrode;

forming a second electrode on said dielectric film;

forming an insulation layer on said layer of organic polysilane and on said second electrode;

said layer of organic polysilane, said first electrode, said dielectric film, said second electrode and said insulation layer forming a layered body on said base material, forming a groove in said layer of organic silane and said insulation layer for dividing said layered body into individual capacitors; and removing said base material.

2. The method as claimed in claim 1, wherein said step of removing said base material is conducted in the state that a tape is attached to a top surface of said insulation layer so as to bridge said groove.

3. A method of manufacturing a substrate for mounting a semiconductor chip, said substrate having a mounting surface carrying thereon terminals for external connection at a lower principal surface and a chip-mounting surface for carrying a semiconductor chip at an upper principal surface, said substrate further including a capacitor embedded right underneath said chip-mounting surface such that said capacitor includes a capacitor part formed of a dielectric film sandwiched by a pair of electrodes and a support body of an organic polysilane film supporting said capacitor part, said capacitor having an insulation film covering said capacitor part, said method comprising the steps of:

bonding said capacitor on a base;

forming an insulation layer on said base such that said insulation layer covers said capacitor;

laminating a plurality of insulation layers on said base so as to cover said capacitor; and removing said base.

* * * * *